(12) United States Patent
Tooher

(10) Patent No.: US 7,990,787 B2
(45) Date of Patent: *Aug. 2, 2011

(54) MEMORY COMPILER REDUNDANCY

(75) Inventor: Michael J. Tooher, Mountain View, CA (US)

(73) Assignee: Stellar Kinetics, LLC, Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/701,519

(22) Filed: Feb. 5, 2010

(65) Prior Publication Data

US 2010/0142298 A1    Jun. 10, 2010

Related U.S. Application Data

(63) Continuation of application No. 12/268,968, filed on Nov. 11, 2008, now Pat. No. 7,675,809, which is a continuation of application No. 11/468,898, filed on Aug. 31, 2006, now Pat. No. 7,460,413, which is a continuation of application No. 11/430,393, filed on May 8, 2006, now Pat. No. 7,154,792, which is a continuation of application No. 10/417,791, filed on Apr. 16, 2003, now Pat. No. 7,046,561.

(51) Int. Cl.
*G11C 29/00* (2006.01)

(52) U.S. Cl. .................................. 365/200; 365/189.07

(58) Field of Classification Search .................. 365/200, 365/189.07
See application file for complete search history.

(56) References Cited

U.S. PATENT DOCUMENTS

| | | | |
|---|---|---|---|
| 5,796,662 A | 8/1998 | Kalter et al. | |
| 6,055,204 A | 4/2000 | Bosshart | |
| 6,363,020 B1 | 3/2002 | Shubat et al. | |
| 6,396,760 B1 | 5/2002 | Behera et al. | |
| 6,400,619 B1 | 6/2002 | Hsu et al. | |
| 6,552,938 B1 | 4/2003 | Anand et al. | |
| 7,046,561 B1 | 5/2006 | Tooher | |
| 7,127,647 B1 | 10/2006 | Zorian et al. | |
| 7,154,792 B2 | 12/2006 | Tooher | |
| 7,237,154 B1 | 6/2007 | Zorian | |
| 7,460,413 B2 | 12/2008 | Tooher | |

OTHER PUBLICATIONS

Stolowitz Ford Cowger LLP; Listing of Related Cases; Feb. 2, 2010; 1 Page.

*Primary Examiner* — Alexander Sofocleous
(74) *Attorney, Agent, or Firm* — Stolowitz Ford Cowger LLP

(57) ABSTRACT

An improved redundancy architecture for embedded memories in an ASIC chip includes one or more compiler-generated embedded memory instances. Each embedded memory instance has a universal register for storing an address of a defective subunit of the memory instance from a variety of sources. A control block is located on the ASIC chip outside of the memory instances. The control block has a defective memory register for storing an address of a defective memory subunit. The address of a defective memory subunit from the defective memory register in the control block is transferred to the universal interface register in the memory instance. In one embodiment, the control block includes fuses for storing a defective subunit address in binary form. A fuse array is located outside of the memory instances and contains laser fuses that represent address of defective subunits for each memory instance. Alternatively, the control block includes a BISTDR (built-in, self-test, diagnostic, and repair) system that provides an address of a defective memory subunit. Means are provided in the memory instances for comparing incoming memory addresses to address bits for defective memory subunits stored in each memory-instance register.

23 Claims, 10 Drawing Sheets

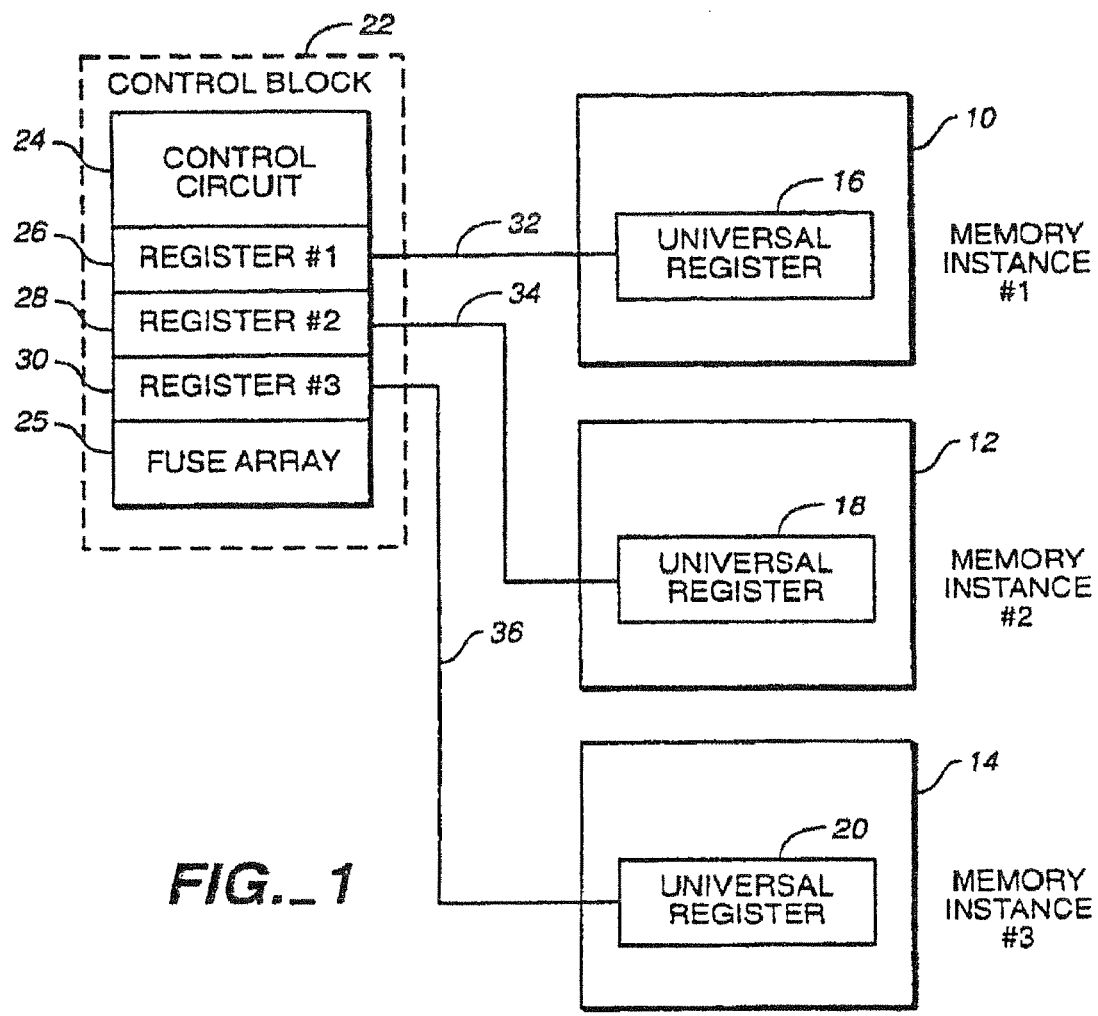
FIG._1

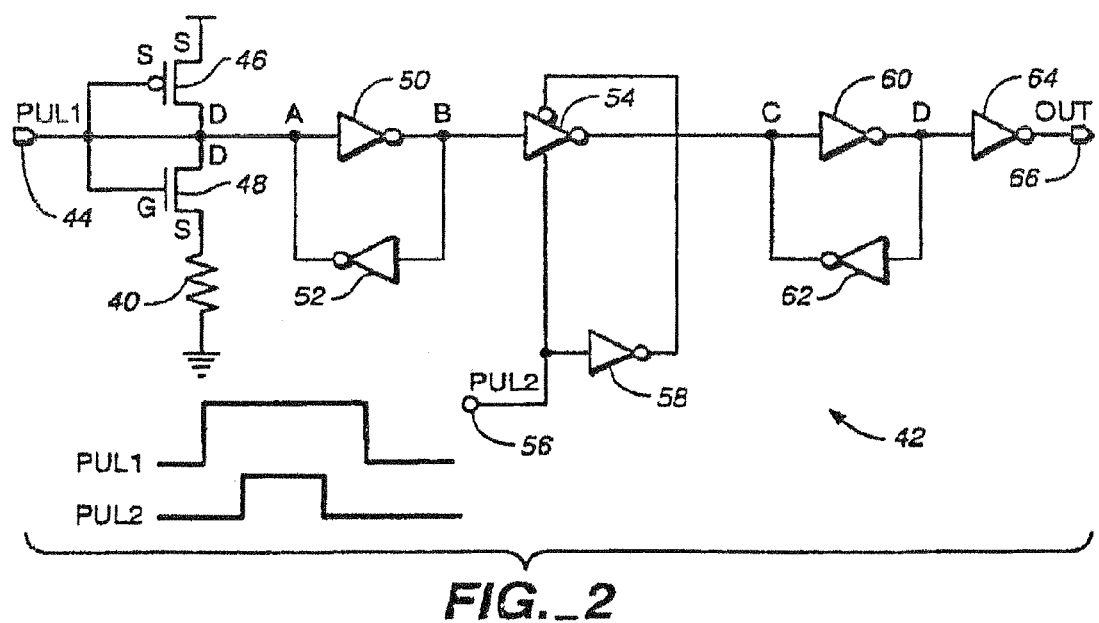
FIG._2

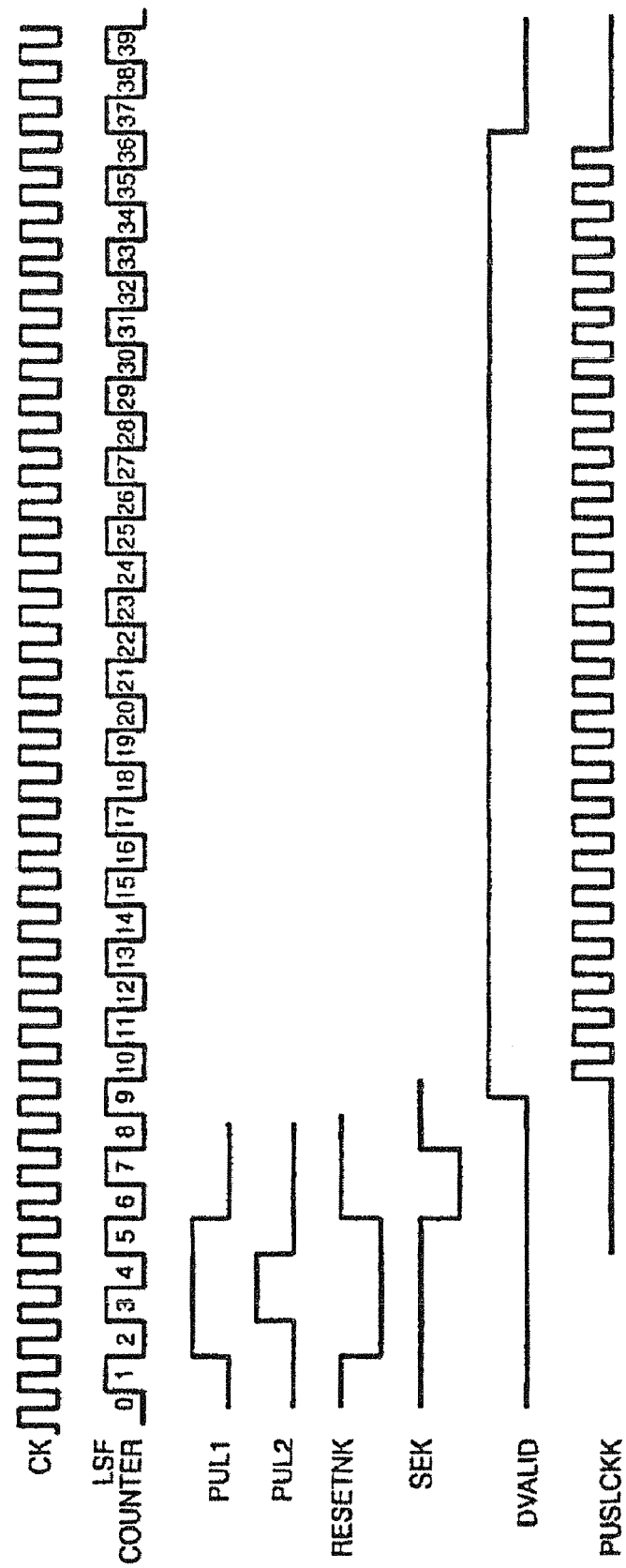
FIG._3

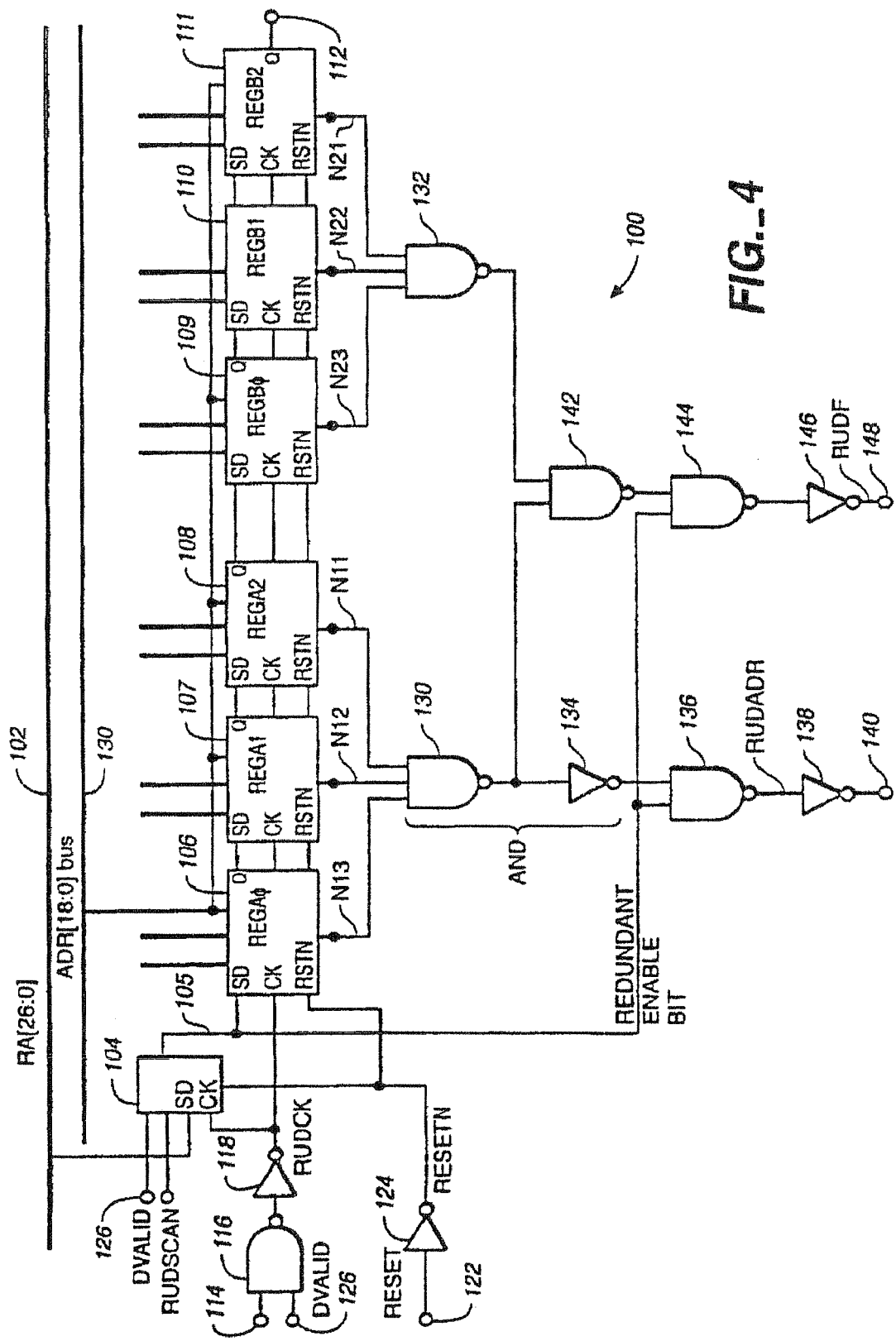
FIG._4

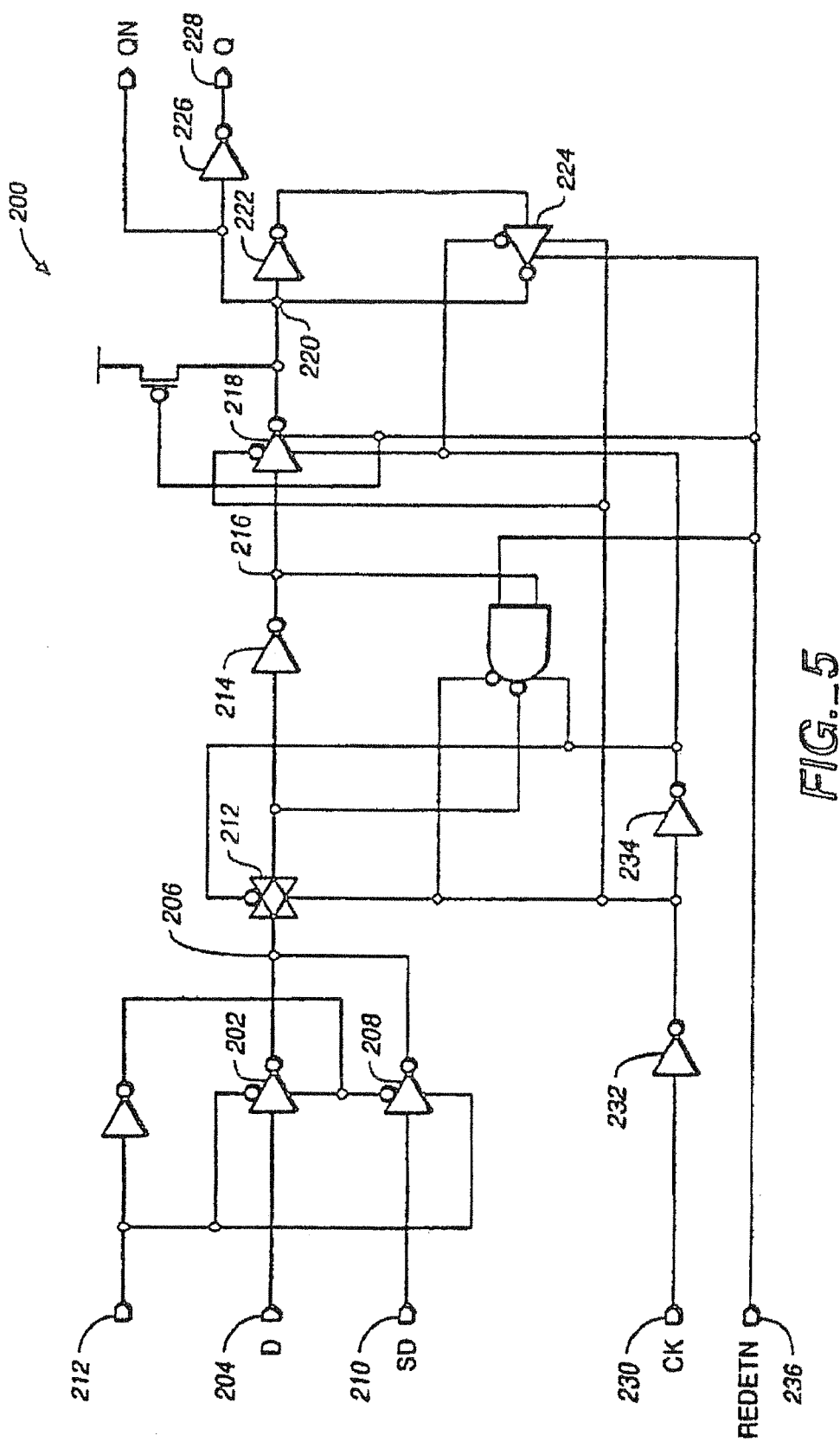
FIG._5

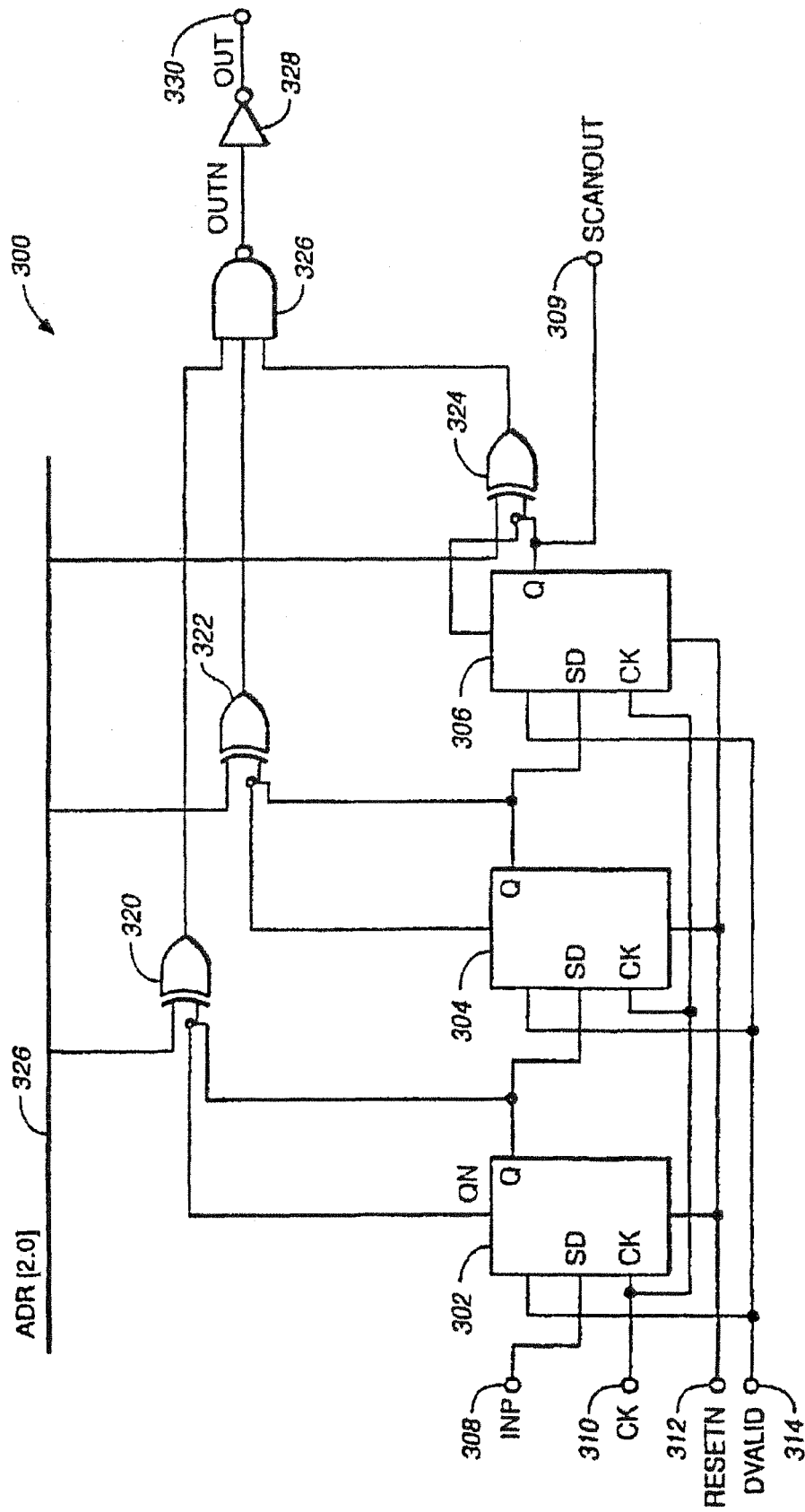
FIG._6

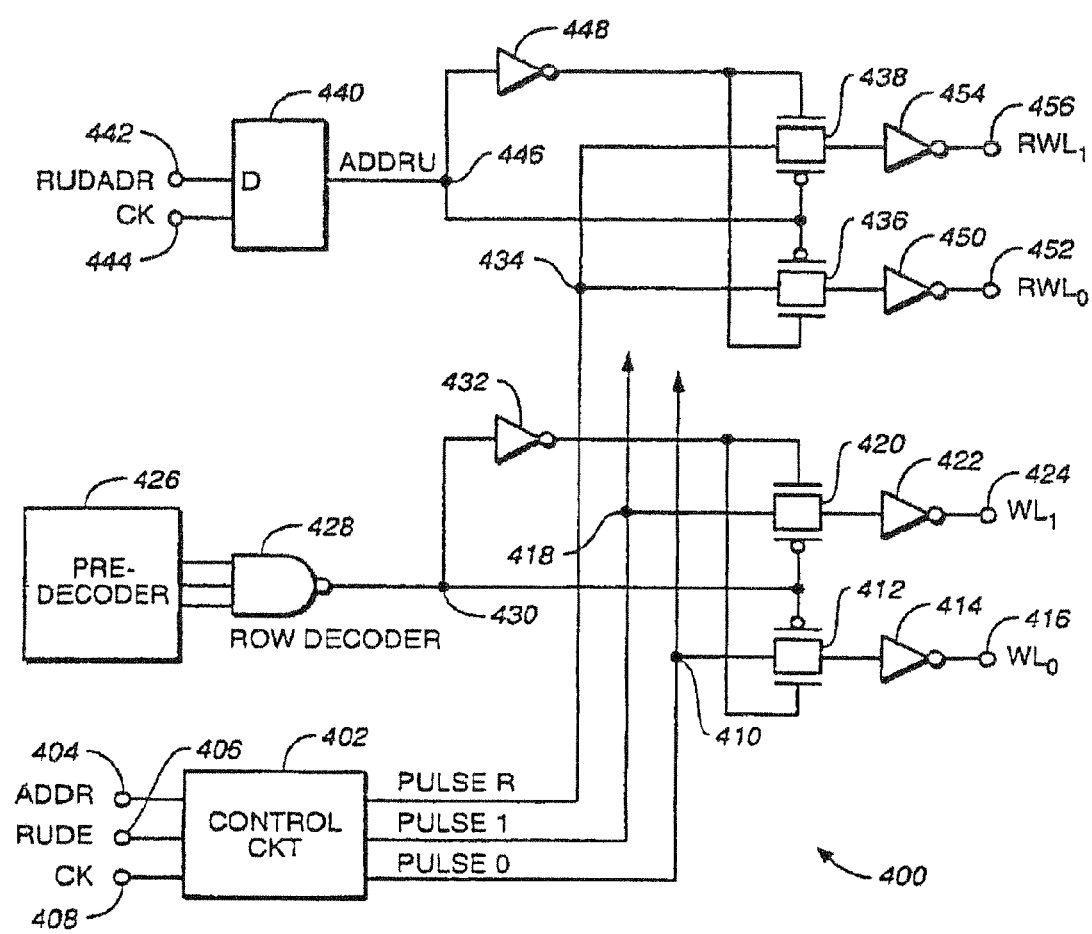
FIG._7

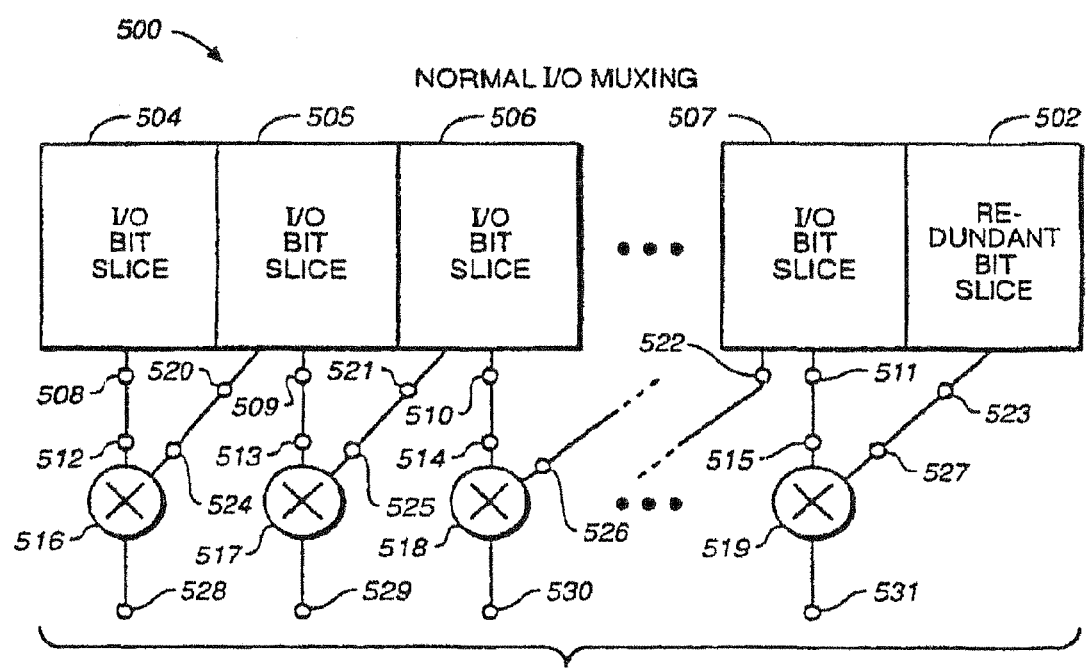
FIG._8

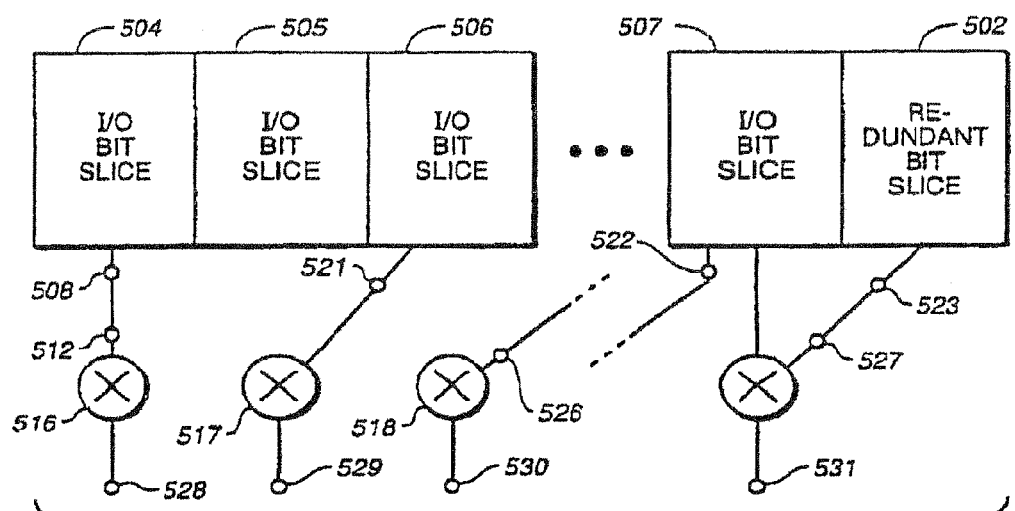
FIG._9

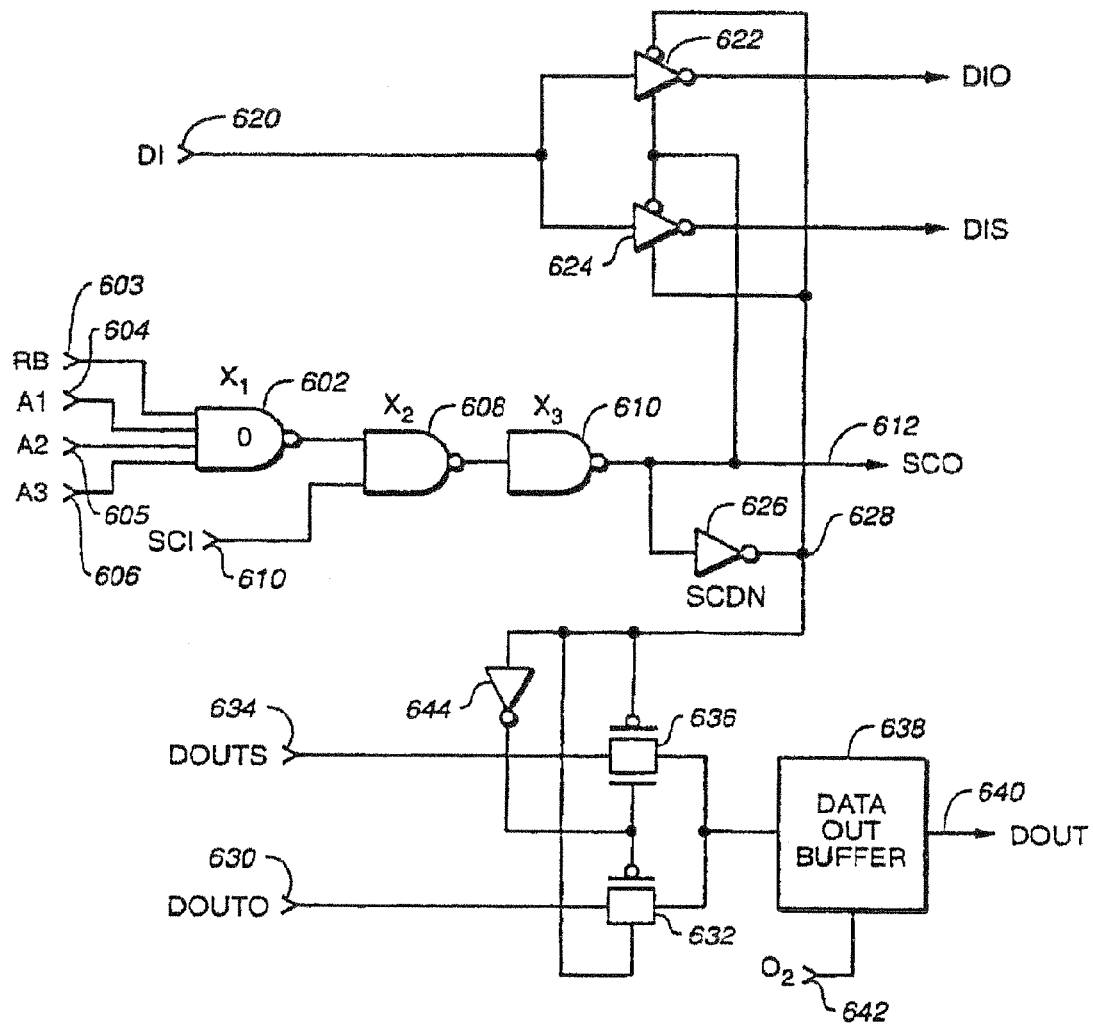
FIG._10

MEMORY COMPILER REDUNDANCY

RELATED APPLICATIONS

This application is a continuation of and claims priority to pending U.S. patent application Ser. No. 12/268,968, filed on Nov. 11, 2008, which is a continuation of and claims priority to U.S. patent application Ser. No. 11/468,898, filed on Aug. 31, 2006, now issued as U.S. Pat. No. 7,460,413, which is a continuation of and claims priority to U.S. patent application Ser. No. 11/430,393, filed May 8, 2006, now issued as U.S. Pat. No. 7,154,792, which is a continuation of and claims priority to U.S. patent application Ser. No. 10/417,791, filed Apr. 16, 2003, now issued as U.S. Pat. No. 7,046,561, all of which are incorporated herein by reference.

BACKGROUND OF THE INVENTION

1. Field of the Invention

This invention relates to an application specific integrated circuit (ASIC) and, more particularly, to an ASIC having a redundancy capability for replacement of defective embedded memory subunits of a memory instance in the ASIC.

2. Prior Art

In the design and production of an ASIC, a compiler, or higher level computer program, is used by an ASIC designer to convert the designer's keystroke inputs from a workstation to tape-out information that is used for generating production masks that are used to fabricate an ASIC chip. An ASIC design can have a number of different functional units provided on a single chip. These functional units include one or more embedded memory instances, or blocks, such as, for example, embedded random access memory (RAM) blocks, that are physically co-located in close proximity to various other types functional blocks on the ASIC.

Sometimes, an embedded memory instance has a defective memory subunit, such as a defective row or a defective input-output (I/O) unit. An I/O unit is a group of several memory columns and a multiplexer that is used to select a particular one of the memory columns for I/O operation. After an ASIC is fabricated and tested, various defective bits (if any) in the memory instances in a particular subunit need to be corrected or replaced by redundant memory circuits. One redundancy technique uses a fuse array that is provided by the compiler to store an address of a defective subunit of an embedded memory instance.

Prior art memory redundancy techniques are focused on stand-alone memories. A stand alone memory chip uses a very limited number of functional units in its design while an ASIC uses a considerably larger number of different functional units in its design. In an ASIC, co-locating a fuse array in the vicinity of a memory instance complicates the design and operation of the ASIC. For example, fuse arrays take up large amounts of chip area and the structure and fabrication of such a fuse array may not be compatible with the structure and fabrication of an ASIC embedded memory instance or other functional blocks located near an embedded memory instance in an ASIC. Consequently, there is a need to provide an improved redundancy architecture for embedded memories in an ASIC chip.

SUMMARY OF THE INVENTION

It is therefore an object of the invention to provide an improved redundancy architecture for embedded memories in an ASIC chip. In accordance with this and other objects of the invention ASIC chip is provided that includes one or more compiler-generated embedded memory where each embedded memory instance has a universal register for storing an address of a defective subunit of the memory instance. A control block is located on the ASIC chip outside of the memory instances. The control block has a defective memory register for storing an address of a defective memory subunit. The address of a defective memory subunit from the defective memory register in the control block is transferred to the universal interface register in the memory instance. In one embodiment of the invention, the control block includes fuses for storing a defective subunit address in binary form. Alternatively, the control block includes a built-in, self-test, diagnostic, and repair (BISTDR) system that provides an address of a defective memory subunit.

The ASIC has one or more compiler-generated embedded memory instances wherein each of the memory instances has a memory array and also has a universal interface register for storing an address of a defective subunit of the memory array. A fuse array is located outside of the memory instances and contains laser fuses that represent address of defective subunits for each memory instance. The fuse array control block has a plurality of registers for storing the address of defective subunits for each memory instance. Means are provided in the memory instances for comparing incoming memory addresses to address bits for defective memory subunits stored in each memory-instance register.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a block diagram of a portion of an ASIC chip that has three memory instances, each having an associated universal interface register, and that has a control circuit and external registers that are located on the ASIC chip away from the memory instances.

FIG. 2 is a circuit diagram of a fuse and a fuse latch circuit that applies no static voltage across the fuse.

FIG. 3 is a timing chart for control signals to operate a redundancy system according to the present invention.

FIG. 4 is a circuit diagram of a universal interface register for storing the addresses of a redundant rows.

FIG. 5 is a circuit diagram of a flip-flop circuit that is used in the universal interface register.

FIG. 6 is circuit diagram of a 3-bit register circuit and exclusive nor circuits that compares incoming address bits to stored address bits for a defective subunit of a memory instance.

FIG. 7 is a circuit diagram for enabling normal and redundant word line enable circuitry.

FIG. 8 is a schematic diagram for normal and shifted I/O connections to an I/O bit slice.

FIG. 9 is a schematic diagram that illustrates how a defective column associated with a defective I/O is switched out of a bit sequence using multiplexer circuits.

FIG. 10 is a circuit diagram of a multiplexer circuit

DETAILED DESCRIPTION OF THE PREFERRED EMBODIMENT

Reference is now made in detail to preferred embodiments of the invention, examples of which are illustrated in the accompanying drawings. While the invention is described in conjunction with the preferred embodiments, it will be understood that it is not intended to limit the invention to these embodiments. On the contrary, the invention is intended to cover alternatives, modifications and equivalents, which may be included within the spirit and scope of the invention as defined by the appended claims.

FIG. 1 is a block diagram of three memory instances 10, 12, 14 that are embedded in various portions of an ASIC chip. The drawing illustrates that each memory instance has associated in close proximity thereto on the ASIC chip a respective universal interface register 16, 18, 20 that provides an interface between a memory array and redundancy control circuitry. A universal interface register is loaded to store memory addresses of defective subunits of an associated memory instance. For purposes of this description, defective memory subunits are, for example, a defective row or a defective input-output (I/O) unit, but are not limited thereto. An I/O unit is a group of several memory columns and a multiplexer that is used to select a particular one of the memory columns for I/O operation. Each of the universal registers is embedded in the ASIC memory instance in close proximity to a respective memory array.

A universal interface register accepts address information for defective subunits from a variety of sources external to the memory instances 12, 14, 16. The source for providing addresses of defective subunits to a universal interface register is optional. Each universal interface register can receive addresses of defective subunits of a memory instance in the memory instance of an ASIC from a number of different types of sources. These sources include, for example, a fuse array, a BISTDR (built-in, self-test, diagnostic, and repair) system, flash memory, etc. An ASIC user has a choice of a source for providing addresses of defective subunits of the memory instances to a universal interface register. This allows information about defective memory subunits to be externally inputted or to be inputted from a different area of an ASIC. Hence the term universal is used to denote that this register can accept the addresses of defective memory subunits from a variety of sources.

Also located on the ASIC chip is a control block 22 that is located outside of and separated from the various memory instances 10, 12, 14 and their associated universal registers 16, 18, 20. The control block includes a control circuit 24 that is used to provide required control signals for the control block 22.

The control block 22 also contains means for providing addresses of defective memory subunits in each of a number of memory instances. The control block includes registers 26, 28, that provide address information for defective subunits of corresponding memory instances. Subunits of the memory instances include, rows, columns, and I/O units. I/O units include a plurality of columns and a multiplexer for selecting one of the columns.

FIG. 1 indicates that one means for providing memory addresses of defective memory subunits include a fuse array 25. Other means for providing defective-memory arrays are Flash memory, and built-in self test, diagnosis, and repair (BISTDR) circuits.

For a system that uses, for example, fuses in a fuse array 25 to identify the addresses of defective memory subunits, an overview of the basic operation of the arrangement of FIG. 1 is as follows: On powerup or system reset, the states of the fuses in the fuse array 25 are loaded into fuse array registers, such as the registers 26, 28, 30. Then the contents of these registers 26, 28, are serially clocked through respective signal lines 32, 34, 36 into the associated universal interface registers 16, 18, 20 that are located in the respective memory instances 10, 12, 14. A memory instance includes a memory array and a universal interface register. The defective-memory address contents of the universal registers 16, 18, 20 are then compared with all incoming memory addresses such that, when there is a match therebetween, an appropriate redundant row is activated or an appropriate I/O is removed and replaced with a redundant I/O.

One embodiment of the invention has a fuse array that is located outside of the memory instances, and that stores defective subunit information. This fuse array contains laser fuses that represent the address bits of bad rows of I/Os for each memory instance. The following fuse embodiment allows for the replacement of two rows and one I/O for each memory instance. This particular embodiment has the capability of replacing bad rows/IO for up to 52 memory instances in the larger functional chip.

FIG. 2 is a circuit diagram of a fuse 40 that is provided in a fuse latch circuit 42. An important feature of the fuse latch circuit 42 is that no static voltage is applied across the fuse 40. One embodiment of the fuse 40 is constructed with an aluminum layer that is used for bond pads on a chip. An extra layout mask is used to define a window over the fuse that allows for a thin layer of passivation oxide to cover the fuse and this thin layer can be easily cut into by a laser to cut the fuse. There is the possibility that a fuse could self-repair if a sliver of fuse material remained after the fuse was cut and if there was a static voltage potential across the fuse that could allow current through the sliver.

To prevent this type of self-repair, the fuse latch circuit 42 provides that there is no static voltage potential across the fuse 40. The fuse latch circuit 42 includes an input terminal 44 for a control signal PULL that is connected to a gate terminal of a PMOS transistor 46 and also to a gate terminal of an NMOS transistor 48. A source terminal of the NMOS transistor 48 is to connected through the fuse 40 to a ground potential. A source terminal of the PMOS transistor 46 is connected to a positive voltage source. The drain terminals of the PMOS transistor 46 and the NMOS transistor 48 are connected together to a node A. The inverters 50, 52 form a latch with node A being connected to an input terminal of the inverter 50 and to an output terminal of the inverter 52. An output terminal of the inverter 50 is connected to an input terminal of the inverter 52 and also to a node B. Node B is connected to an input terminal of a CMOS transmission gate 54. An input terminal 56 for a control signal PUL2 is connected to a control terminal of the transmission gate 54. Terminal 56 is also connected to an input terminal of an inverter 58 which has an output terminal that is connected to a complementary control terminal of the CMOS transmission gate 54. An output terminal of the CMOS transmission gate 54 is connected to a node C. Inverters 60 and 62 form a latch with node C being connected to an input terminal of inverter 60 and to an output terminal of the inverter 62. An output terminal of the inverter 60 is connected to a node D. Node D is connected through an inverter 64 to an OUT terminal 66.

FIG. 2 illustrates the PULL signal as a single positive pulse signal that is generated after powerup or system reset. Signal PUL2 is also illustrated as a somewhat later and shorter, single positive pulse signal that is generated after powerup or system reset. The PUL1 signal goes HIGH to evaluate the state of the fuse 40. The PUL2 signal goes high to latch the state of the fuse. If the fuse 40 is blown, node A goes low, node B goes high, and a high signal is gated into the latch 60, 62 when the signal PUL2 goes high. The latch 60, 52 holds its state when PUL2 goes low. If the fuse 40 is not blown, the opposite state is latched in the latch 60, 62. When PUL1 goes low, the NMOS transistor 48 is cut off so that no static current can be applied through a blown fuse sliver of fuse 40.

FIG. 3 illustrates a timing chart for control signals that are provided by the control circuit 24 for internal timing of redundant control circuitry. Control logic detects the negative edge of a chip reset signal and then energizes a T flop counter that counts up to 39, which resets the control logic until the next reset signal. The various control signals are created generically by the use of D flip-flops that are set and reset by detecting various counts from a counter.

Signal CK is the system clock. Signal LSF COUNTER shows the least significant output of the counter with the associated count. PUL1 and PUL2 are as explained above. Signal RESETNK resets the fuse array register. SEK loads the output of the fuses into the fuse array register. FUSECKK provides 27-gated clock pulses that serially load the fuse array register into a bit register of the memory instance. DVALID gates FUSECKK into the memory instance register.

For one embodiment of the invention, the fuse array register has 27 bits and is made up of ordinary D flops. This allows for two row addresses of 9 bits each, plus one row redundant enable bit (1 bit) and 7 address bits of one defective I/O plus one I/O redundant enable bit. There are 512 rows so the row bits are 9 bits apiece for the row address plus the row redundant enable bit for a total 19 bits allocated for row redundancy. There are a possible 128 I/Os in the compiler, so this accounts for the (remaining 8 bits. Seven bits for the I/O number and one bit for the 10 redundant enable bit for a grand total of 27 bits.

Another embodiment of the invention uses a compiler that designs redundancy capability into an ASIC and memory instances and also provides the addresses of defective memory arrays, but with a BISTDR logic engine also outside of the memory instances. This BISTR logic engine self tests and replaces bad bits on powerup and system resets, with logic rather than with fuses. Customers using such an ASIC are unaware of the mode of obtaining defective memory addresses.

The next step after powerup or system reset and after loading the fuse array information from the fuses into the fuse array register or after loading the BISTDR information, is to serially load the information from the fuse array register to the memory instance 27 bit redundant register. Once this is done, the fuse array control logic or other logic has finished its job and reaches a steady state condition, with no more signal toggling, and waits for the next system reset. After this, logic circuit in the memory instances take control.

FIGS. 4, 5, and 6 show the details of a 19-bit register circuit 100 in a memory instance. The 19-bit register circuit 100 stores the addresses of defective rows that are to be replaced by redundant rows. The 19-bit register circuit 100 also monitors the memory address input signals to detect the occurrence of an address for a defective row. The 19-bit register circuit 100 stores addresses of two redundant rows that replace two defective rows in the memory instance. The 19-bit register circuit 100 handles 19 bits, including 18 row address bits for two 9-bit addresses and one row redundancy enable bit.

A single signal line 102 receives the 27-bit serial bit stream RA[26:0] from the FUSE ARRAY REGISTER. A serial data input terminal SD of a 1-bit register circuit 104 is connected to the signal line 102 to receive the 27-bit serial bit stream from the FUSE ARRAY REGISTER. A REDUNDANT ENABLE BIT is provided at a Q output terminal of the 1-bit register circuit 102, which is connected by a signal line 105 to a serial input terminal SD of a first 3-bit register 106 of a serially-loaded 18-bit register that is formed with six series-connected 3-bit register circuits 106, 107, 108, 109, 110, 111. The six 3-bit register circuits 106, 107, 108, 109, 110, 111 are connected in series such that a Q output terminal of the first 3-bit register 106 is connected to a SD input terminal of its neighboring 3-bit register 107, and so on for the rest of the 3-bit registers. The Q output terminal is connected to a terminal 112 to provide a redundant SCAN OUTPUT signal RUDSCANOUT to an input terminal of an 8-bit I/O register that stores an address of a redundant I/O address.

A clock signal CK is applied to one input terminal 114 of a 2-input AND gate that is formed with a 2-input NAND gate 116 in series with an inverter 118. The DVALID signal is applied to the other input terminal 120 of the 2-input AND gate. When the DVALID signal is HIGH, the CK signal is gated through the AND gate to provide a redundant clock signal RUDCLK that is applied to the clock terminals of the 1-bit register circuit 104. The redundant clock signal RUDCLK is also applied to the clock terminals of the six 3-bit resister circuits 106, 107, 108, 109, 110, 111.

A reset pulse is provided to an input terminal 122 of an inverter 124 that provides an inverted output signal RESETN that is applied to respective reset terminals of the 1-bit register and the six 3-bit register circuits 106, 107, 108, 109, 110, 111.

The DVALID signal is also connected to an enable input terminal 126 of the 1-bit register circuit 102 to allow 27 bits of the serial data from the single signal line 102 to be serially clocked through the 1-bit register circuit 102 and through the six 3-bit register circuits and the 8-bit I/O register.

After the fuse array information is loaded from the fuses into the fuse array register, the 27 bits of information from the fuse array register are serially transferred and loaded into the memory instance 27-bit redundant register. The memory instance 27-bit redundant register includes the 19-bit register circuit 100 and the 8-bit I/O register (NOT SHOWN).

Each of the 3-bit registers also contain EXCLUSIVE-OR circuits that compare the contents of a respective 3-bit register to respective bits of the address signals provided on a 19-line memory address bus 130 for nineteen address bits ADB[18:0]. Each of the three 3-bit registers 106, 107, 108 contain three bits of one 9-bit defective row address. Similarly, each of the three 3-bit registers 109, 110, 111 contain three bits of another 9-bit defective row address.

Each of the 3-bit registers contains an EXCLUSIVE-OR circuit that provide signals at all three respective output nodes N13, N12, N11 when a match is obtained for one defective row address and that provides signals at all three respective output nodes N23, N22, N21 for the other defective row address. The nodes N13, N12, N1 are connected to respective input terminals of a 3-input NAND gate 130. Similarly, the nodes N23, N22, N21 are connected to respective input terminals of a 3-input NAND gate 132.

An output terminal of the 3-input NAND gate 130 is connected to an input terminal of an inverter 134 such that the 3-input NAND gate 1130 and the inverter 134 form a 3-input AND gate. An output terminal of the inverter 134 is connected to one input terminal of a NAND gate formed with a 2-input NAND gate in series with an inverter 138. The REDUNDANT ENABLE BIT provided at the Q output terminal of the 1-bit register circuit 104 is connected to the other input terminal of the 2-input NAND gate 136. When the REDUNDANT ENABLE BIT is HIGH and all three nodes N13, N12, N11 are HIGH, a redundant address RUDADR signal is provided at an output terminal 140 of the inverter 138 goes HIGH to indicate that the address of the one defective row has been received on the bus 130.

An output terminal of the 3-input NAND gate 132 is connected to one input terminal of a 2-input NAND gate 142. The other input terminal of the 2-input NAND gate 142 is connected to the output terminal of the 3-input NAND gate 130.

An output terminal of the 2-input NAND gate 142 is connected to one input terminal of a 2-input NAND gate 144. The other input terminal of the 2-input NAND gate 144 is connected to the REDUNDANT ENABLE BIT provided at the Q output terminal of the 1-bit register circuit 104. The 2-input NAND gate 144 is connected in series with an inverter 146 to provide an AND function. An output terminal of the inverter 146 provides a redundancy enable signal RUDE.

The nodes N13, N12, and N11 indicate matching of one failure address and nodes N23, N22, and N21 indicate matching of the second failure address.

The redundancy enable RUDE signal at the output terminal of the inverter 146 goes to a HIGH when there is a match for either one of the failure addresses with an incoming address. The signal RUDADR at terminal 140 indicates which of the two possible failure addresses has been a match with an incoming address.

An advantage of the present invention is that delay is not introduced into the system because the delay through the comparators is hidden within the normal setup and hold time of the address decoder. If both row and I/O redundancy is used, there is a speed penalty.

FIG. 5 illustrates a flip-flop circuit 200 that is a standard cell that is used for the 1-bit register circuit 104 and also for each register cell of the 3-bit registers 106, 107, 108, 109, 110. A first CMOS transmission gate 202 connects a D-input node 204 to an input node 206. A second CMOS transmission gate 208 connects a SD-input node 210 to the input node 206. A DVALID input signal is provided at a DVALID input terminal and is inverted by an inverter 214. The DVALID and inverted DVALID input signals control the CMOS transmission gates 202, 208 so that a SD input signal is provided at input node 206 when the DVALID signal is HIGH. Otherwise, a grounded D input signal is connected to the input node 206.

A resettable latch 212 has an input terminal that is connected to the input node 206 and an output terminal that is connected through an inverter 2114 to a node 216. Another CMOS transmission gate connects node 216 to an input node 220 of a latch formed with an inverter 222 and a CMOS transmission gate 224. A Q output signal is provided through an inverter 226 to a Q output terminal from the node 220. An input clock signal CK is provided at an input terminal 230 and passed through a first inverter 232 and then through a second inverter 234 to provide various control signals. An inverted reset signal RESETN is provided to an input terminal 236 to provide various reset signals.

FIG. 6 illustrates a 3-bit register circuit 300 such as shown in FIG. 4 as one of the 3-bit registers 106, 107, 108, 109, 110, 111. The 3-bit register circuit 300 includes three series-connected scanable flip-flop circuits 302, 304, 306 that are like the scanable flip-flop circuit 200 of FIG. 5. The 3-bit register circuit 300 has a data input terminal 308 that is connected to the SD input terminal of the first scanable flip-flop circuits 302. A clock input CK terminal 310 is connected to the clock input CK terminals of each of the three scanable flip-flop circuits 302, 304, 306. An inverted reset signal RESETN is connected to an inverted reset input terminal 312 of each of the three scanable flip-flop circuits 302, 304, 306. A DVALID input terminal 314 is connected to each of the three scanable flip-flop circuits 302, 304, 306. The CK signal serially clocks data through the three flip-flop circuits 302, 304, 306, such that each flip-flop circuit has a Q output terminal and an inverted Q terminal QN. The Q output terminal of the scanable flip-flop circuit 306 is connected to a SCANOUT terminal which is connected to a next 3-bit register.

FIG. 6 also shows three 3-input EXCLUSIVE-OR circuits 320, 322, 324 for comparing three incoming address bits provided on the 3-bit address bus ADR[2:0] 326 to the Q and QN bits stored in a respective one of the scanable flip-flop circuits 302, 304, 306. The 3-bits are predetermined bits that are part of the 19-line memory address bus 130.

The 3-input EXCLUSIVE-OR circuit 320 has one input terminal connected to one of the address lines of the bus 320. A second input terminal is connected to the Q terminal of the scanable flip-flop circuit 302. A third inverted input terminal is connected to the QN terminal of the scanable flip-flop circuit 302.

The 3-input EXCLUSIVE-OR circuit 322 has one input terminal connected to a second one of the address lines of the bus 320. A second input terminal is connected to the Q terminal of the scanable flip-flop circuit 304. A third inverted input terminal is connected to the QN terminal of the scanable flip-flop circuit 304.

The 3-input EXCLUSIVE-OR circuit 324 has one input terminal connected to a third one of the address lines of the bus 320. A second input terminal is connected to the Q terminal of the scanable flip-flop circuit 306. A third inverted input terminal is connected to the QN terminal of the scanable flip-flop circuit 306.

Output terminals of the three EXCLUSIVE-OR circuits 320, 322, 324 are connected to respective ones of the input terminals of a 3-input NAND gate 326. An output terminal of the 3-input NAND gate 326 is connected to an input terminal of an inverter 328 that provides an OUT signal at an output terminal 330. Output terminal 330 is the same as terminals N13, N12, N11, N23, N22, or N21 of FIG. 4. The EXCLUSIVE-OR circuits compare the defective-row-address bits in the registers 302, 304, 306 with respective incoming address bits, and when there is a match, signal OUT goes to a HIGH.

FIG. 7 is a simplified schematic diagram for word-line enable circuitry 400 that is used to enable both normal rows and redundant rows. A control circuit 402 has an address input terminal 404 that receives a single address bit ADDR, a redundant input terminal 406 that receives a redundant enable RUDE signal, and a clock input terminal 408 that receives the clock CK signal. As discussed in connection with FIG. 4, the redundancy enable RUDE signal goes to a HIGH when there is a match for either one of the failure addresses with an incoming address.

For normal operation, the redundant enable RUDE signal is inactive and the clock signal causes the control circuit 402 to provide either a negative PULSE0 pulse output signal or a negative PULSE1 pulse output signal, depending on the value of the single address bit ADDR. The negative pulse signal for the PULSE0 signal is then provided to an input terminal 410 of a CMOS transmission gate 412. An output terminal of the CMOS transmission gate 412 is connected through an inverter 414 to an output terminal 416 at which is provided a normal wordline enable signal WL0. Similarly, the negative pulse signal for the PULSE1 signal is provided to an input terminal 418 of another CMOS transmission gate 420. An output terminal of the CMOS transmission gate 420 is connected through an inverter 422 to an output terminal 424 at which is provided a normal wordline enable signal WL1.

A predecoder circuit 426 detects certain row addresses and provides input signals to a row decoder that is a multi-input NAND gate 428. The NAND gate 428 provides a row decoder control signal to a node 430 that is connected to PMOS gate terminals of the CMOS transmission gates 412, 420. Node 430 is connected through an inverter 432 to NMOS gate terminals of the CMOS transmission gates 412, 420. The row decoder control signal enables the CMOS transmission gates 412, 420 to provide the normal wordline enable signals WL0 and WL1 for normal operation.

For redundant operation, when the redundant enable input signal RUDE at terminal 406 goes active, the redundant pulse signal PULSER signal goes active negative when a clock pulse CK is received. In this case, the control circuit 402 prevents both the PULSE0 signal and the PULSE1 signal from going active.

When the redundant enable input signal RUDE at terminal 406 of the control circuit 402 goes active, the redundant PULSER signal is provided to a node 434 that is connected to an input terminal of a CMOS transmission gate 436 and to an input terminal of another CMOS transmission gate 438. A D flip-flop circuit 440 has a D input terminal at which is provided the redundant address RUDADR signal from the 19-bit register circuit 100 of FIG. 4. A clock signal CK at a clock input terminal 444 provide an ADDRU signal to an output terminal 446 of the D flip-flop circuit 440.

As indicated in the discussion in connection with FIG. 4, the signal RUDADR at terminal 140 indicates which of the two possible failure addresses has been a match with an incoming address.

The ADDRU signal at node 446 is connected to PMOS gate terminals of the transmission gates 436, 438. Node 446 is connected through an inverter 448 to NMOS gate terminals of the CMOS transmission gates 436, 438. Node 446 is directly connected to PMOS gate terminals of the CMOS transmission gates 436, 438.

An output terminal of the CMOS transmission gate 436 is connected through an inverter 440 to an output terminal 442 at which is provided a redundant wordline enable signal WRWL0. An output terminal of the CMOS transmission gate 438 is connected through an inverter 444 to an output terminal 446 at which is provided a redundant wordline enable signal RWL1.

FIGS. 8 and 9 show a schematic diagram for a memory system 500 that provides a redundant column input/output (I/O) bit slice 502 when there is a defective I/O bit slice in a regular column I/O bit slice. Illustratively shown are some regular column I/O bit slices 504, 505, 506, 507, which are some of a larger number of regular column bit slices for a memory device. Internally, each of the regular column I/O bit slices contains two or more memory columns, an internal y-multiplexer for selecting one of those memory columns, and a sense amplifier.

Each of the regular column bit I/O bit slices 504, 505, 506, 507 has a respective I/O terminal 508, 509, 510, 511 that is connected to first respective I/O terminal 512, 513, 514, 515 of a respective multiplexer 516, 517, 518, 519. The regular column I/O bit slices 505, 506, 507 and the redundant bit slice 502 each also have a second respective I/O terminal 520, 521, 522, 523 that is cross-connected to another I/O terminal 524, 525, 526, 527 of a respective neighboring multiplexer 516, 517, 518, 519.

Normal operation occurs when there are no defective I/O bit slices. For normal operation, the first respective I/O terminals 512, 513, 514, 515 are connected through the respective multiplexers 516, 517, 516, 519 to respective third I/O terminals 528, 529, 530, 531.

Redundant operation occurs when one of the I/O bit slices is defective. For redundant operation, FIG. 9 illustrates how the multiplexers 516, 517, 518, 519 are used to isolate and bypass a defective column, such as, for example, the I/O bit slice 505. The multiplexers provide a shift mechanism that has the redundant bit slice 502 and its associated columns placed on one side of the array. The columns associated with the detective I/O bit slice are isolated and not used. Instead the column data associated with the defective I/O slice are shifted by the multiplexers 517, 518, 519 to adjacent I/O bit slices.

The shift continues all the way to the redundant bit slice 502. The redundant bit slice 502 contains the same amount of columns as a I/O bit slice.

FIG. 10 is a circuit diagram of a typical multiplexer circuit 600, such as one of the multiplexers 516, 517, 518, 519 of FIGS. 8 and 9. A 4-input NAND gate 602 has one input terminal 603 for receiving a RBE signal that is the buffered redundant I/O enable bit from the 1-bit register circuit 104 of the memory instance redundant register, provided by the 19-bit register circuit 100. Three other r input terminals 604, 605, 606 to the 4-input NAND gate receives address signals A1, A2, and A3 which are predecoded signals derived from the 7 redundant I/O bit address also contained in the memory instance redundant register.

An output terminal of the 4-input NAND gate 602 is connected to one input terminal of a 2-input NAND gate 608. An SCI input terminal 610 of the 2-input NAND gate receives a shift-carry input signal SCI from a neighboring I/O bit slice. An output terminal of the 2-input NAND gate in connected to an input terminal of an inverter 610. A output terminal of the inverter 610 is connected to an SCO output terminal 612 at which is provided a shift-carry output signal SCO. The SCO output terminal 612 of one I/O bit slice is connected to an SCI input terminal of the next I/O bit slice to form a chain across all of the I/O bit slices.

The SCI signal, when active low, indicates that a shift to the next I/O bit slice is required. Another way to require a shift is for the output of the 4-input NAND gate 602 to go low, which occurs when the associated I/O bit slice is defective. Both of these shift requirements result in the SCO signal going active low.

A data-in DI terminal 620 is connected to input terminals of two CMOS transmission gates 522, 624. The SCO output terminal 612 is connected the PMOS control gate of the CMOS transmission gate 624 and to the NMOS control gate of the CMOS transmission gate 622. The SCO output terminal 612 is also connected to an inverter that has an SCON output terminal 628 at which is provided an inverted shift-carry output signal SCON. The SCON output terminal 628 is connected to the NMOS control gate of the CMOS transmission gate 624 and the PMOS control gate of the CMOS transmission gate 622.

A normal data-out signal DOUTO is applied to a terminal 630 that is connected to an input terminal of a CMOS transmission gate 632. A shifted data-out signal is applied to a terminal 634 that is connected to an input terminal of a CMOS transmission gate 636. Both output terminals of the CMOS transmission gates 632, 636 are connected to an input terminal of a data-out buffer circuit 638. The data-out buffer circuit 638 has a tri-state output terminal at which is provided a DOUT signal when an output enable signal OE is provided at an enable terminal 642 thereof. The SCON output terminal 62B is connected to a PMOS control terminal of the transmission gate 636 and the NMOS control gate of the transmission gate 632. Terminal 628 is also connected to an input terminal of an inverter 642 that has an output terminal connected to the PMOS control gate of the CMOS transmission gate 632 and to the NMOS control gate of the CMOS transmission gate 636.

An active LOW state of the SCO signal causes the DI signal to be shifted over to the next I/O bit slice. The active LOW state of the SCO signal also cause the DOUT signal to receive its input from the shifted DOUTS signal as outputted from the next I/O bit slice. When the SCO signal is inactive HIGH, the Dl and DOUT signal are normally connected to normally configured I/O bit slices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An integrated circuit, comprising:
    a memory circuit including a universal register configured to store a memory address of a defective subunit received from a source external to the memory circuit;
    a comparison circuit configured to compare the memory address to an incoming memory address; and
    a replacement circuit configured to replace the defective subunit with a redundant subunit in response to the comparison.

2. The integrated circuit of claim 1, wherein the defective subunit includes a row, a column, or an I/O unit.

3. The integrated circuit of claim 1, wherein the redundant subunit includes a row, a column, or an I/O unit.

4. The integrated circuit of claim 1, wherein the source includes a fuse array, flash memory, or a built-in test, diagnosis, and repair (BISTDR) circuit.

5. The integrated circuit of claim 1, further comprising a control circuit configured to provide the memory circuit with the memory address.

6. The integrated circuit of claim 5, wherein the control circuit includes a memory register configured to store a state of a fuse array.

7. The integrated circuit of claim 6, wherein the memory register is configured to store the state of the fuse array on power-up or reset.

8. The integrated circuit of claim 5, wherein the control circuit includes an output circuit configured to serially transfer the memory address to the memory circuit.

9. An apparatus, comprising:
    means for storing a memory address of a defective subunit received from a source external to the memory circuit, wherein the means for storing includes a universal register;
    means for comparing the memory address to an incoming memory address; and
    means for replacing the defective subunit with a redundant subunit in response to the means for comparing.

10. The apparatus of claim 9, wherein the defective subunit includes a row, a column, or an I/O unit.

11. The apparatus of claim 9, wherein the redundant subunit includes a row, a column, or an I/O unit.

12. The apparatus of claim 9, wherein the source includes a fuse array, flash memory, or a built-in test, diagnosis, and repair (BISTDR) circuit.

13. The apparatus of claim 9, further comprising means for providing the memory circuit with the memory address.

14. The apparatus of claim 13, wherein the means for providing includes means for storing a state of a fuse array.

15. The apparatus of claim 14, wherein the means for storing the state of the fuse array is configured to operate in response to a power-up or reset signal.

16. The apparatus of claim 13, wherein the means for providing includes means for serially transmitting the memory address to the memory circuit.

17. A method, comprising:
    receiving an address of a defective subunit in a memory instance from a source external to the memory instance;
    storing the address in a universal register included in the memory instance;
    comparing an incoming address with the stored address; and
    replacing the defective subunit with a redundant subunit in response to the comparison.

18. The method of claim 17, wherein the defective subunit includes a row, a column, or an I/O unit.

19. The method of claim 17, wherein the redundant subunit includes a row, a column, or an I/O unit.

20. The method of claim 17, wherein the source includes a fuse array, flash memory, or a built-in test, diagnosis, and repair (BISTDR) circuit.

21. The method of claim 17, further comprising transmitting the address of the defective subunit from a register to the universal register.

22. The method of claim 21, further comprising loading a state of a fuse array into the register in response to a power-up or a reset signal.

23. The method of claim 22, further comprising serially transmitting the address to the universal register.

* * * * *

UNITED STATES PATENT AND TRADEMARK OFFICE
CERTIFICATE OF CORRECTION

| | | |
|---|---|---|
| PATENT NO. | : 7,990,787 B2 | Page 1 of 1 |
| APPLICATION NO. | : 12/701519 | |
| DATED | : August 2, 2011 | |
| INVENTOR(S) | : Tooher | |

It is certified that error appears in the above-identified patent and that said Letters Patent is hereby corrected as shown below:

Column 1, line 6, delete "pending U.S." and insert -- U.S. --.

Signed and Sealed this
Third Day of January, 2012

David J. Kappos
*Director of the United States Patent and Trademark Office*